United States Patent
Paolini, Jr.

(10) Patent No.: US 9,671,635 B2
(45) Date of Patent: Jun. 6, 2017

(54) ELECTRO-OPTIC DISPLAY BACKPLANE STRUCTURES WITH DRIVE COMPONENTS AND PIXEL ELECTRODES ON OPPOSED SURFACES

(71) Applicant: E Ink Corporation, Billerica, MA (US)

(72) Inventor: Richard J. Paolini, Jr., Framingham, MA (US)

(73) Assignee: E Ink Corporation, Billerica, MA (US)

( * ) Notice: Subject to any disclaimer, the term of this patent is extended or adjusted under 35 U.S.C. 154(b) by 0 days.

(21) Appl. No.: 14/615,617

(22) Filed: Feb. 6, 2015

(65) Prior Publication Data

US 2015/0228666 A1    Aug. 13, 2015

Related U.S. Application Data

(60) Provisional application No. 61/937,168, filed on Feb. 7, 2014.

(51) Int. Cl.
| | |
|---|---|
| *H01L 27/14* | (2006.01) |
| *G02F 1/1333* | (2006.01) |
| *H01L 27/32* | (2006.01) |
| *G02F 1/1345* | (2006.01) |
| *G02F 1/167* | (2006.01) |

(52) U.S. Cl.
CPC ...... *G02F 1/13336* (2013.01); *G02F 1/13452* (2013.01); *G02F 1/167* (2013.01); *H01L 27/3255* (2013.01); *H01L 27/3272* (2013.01); *G02F 2201/42* (2013.01)

(58) Field of Classification Search
USPC ........ 257/72, 59, E27.13, E27.133, E27.134
See application file for complete search history.

(56) References Cited

U.S. PATENT DOCUMENTS

| | | | |
|---|---|---|---|
| 4,418,346 | A | 11/1983 | Batchelder |
| 5,760,761 | A | 6/1998 | Sheridon |
| 5,777,782 | A | 7/1998 | Sheridon |
| 5,808,783 | A | 9/1998 | Crowley |
| 5,872,552 | A | 2/1999 | Gordon, II |
| 6,054,071 | A | 4/2000 | Mikkelsen, Jr. |
| 6,055,091 | A | 4/2000 | Sheridon |
| 6,097,531 | A | 8/2000 | Sheridon |
| 6,124,851 | A | 9/2000 | Jacobson |
| 6,128,124 | A | 10/2000 | Silverman |
| 6,130,773 | A | 10/2000 | Jacobson |
| 6,130,774 | A | 10/2000 | Albert |
| 6,137,467 | A | 10/2000 | Sheridon |
| 6,144,361 | A | 11/2000 | Gordon, II |
| 6,147,791 | A | 11/2000 | Sheridon |
| 6,172,798 | B1 | 1/2001 | Albert |
| 6,177,921 | B1 | 1/2001 | Comiskey |
| 6,184,856 | B1 | 2/2001 | Gordon, II |

(Continued)

FOREIGN PATENT DOCUMENTS

JP    2012118342    6/2012

OTHER PUBLICATIONS

Hayes, R.A., et al., "Video-Speed Electronic Paper Based on Electrowetting", Nature, vol. 425, Sep. 25, pp. 383-385 (2003) Sep. 25, 2003.

(Continued)

*Primary Examiner* — Timor Karimy
(74) *Attorney, Agent, or Firm* — Zhen Bao

(57) ABSTRACT

This invention relates to an electro-optic display having a backplane with a front surface and a reverse surface on opposed sides of the backplane, a front surface having a plurality of pixel electrodes arranged in a matrix of columns and rows with column and row lines, a reverse surface having at least one driver chip, and conductive vias electrically connecting the column and row lines on the front surface to the driver chip on the reverse surface, such that the entire front surface area may be optically active.

9 Claims, 8 Drawing Sheets

(56) References Cited

U.S. PATENT DOCUMENTS

| | | |
|---|---|---|
| 6,225,971 B1 | 5/2001 | Gordon, II |
| 6,232,950 B1 | 5/2001 | Albert |
| 6,241,921 B1 | 6/2001 | Jacobson |
| 6,252,564 B1 | 6/2001 | Albert |
| 6,268,898 B1 * | 7/2001 | Ihara .................. 349/155 |
| 6,271,823 B1 | 8/2001 | Gordon, II |
| 6,301,038 B1 | 10/2001 | Fitzmaurice |
| 6,312,304 B1 | 11/2001 | Duthaler |
| 6,312,971 B1 | 11/2001 | Amundson |
| 6,376,828 B1 | 4/2002 | Comiskey |
| 6,392,786 B1 | 5/2002 | Albert |
| 6,413,790 B1 | 7/2002 | Duthaler |
| 6,422,687 B1 | 7/2002 | Jacobson |
| 6,445,374 B2 | 9/2002 | Albert |
| 6,480,182 B2 | 11/2002 | Turner |
| 6,498,114 B1 | 12/2002 | Amundson |
| 6,506,438 B2 | 1/2003 | Duthaler |
| 6,518,949 B2 | 2/2003 | Drzaic |
| 6,521,489 B2 | 2/2003 | Duthaler |
| 6,535,197 B1 | 3/2003 | Comiskey |
| 6,545,291 B1 | 4/2003 | Amundson |
| 6,639,578 B1 | 10/2003 | Comiskey |
| 6,657,772 B2 | 12/2003 | Loxley |
| 6,664,944 B1 | 12/2003 | Albert |
| D485,294 S | 1/2004 | Albert |
| 6,672,921 B1 | 1/2004 | Liang |
| 6,680,725 B1 | 1/2004 | Jacobson |
| 6,683,333 B2 | 1/2004 | Kazlas |
| 6,724,519 B1 | 4/2004 | Comiskey |
| 6,750,473 B2 | 6/2004 | Amundson |
| 6,788,449 B2 | 9/2004 | Liang |
| 6,816,147 B2 | 11/2004 | Albert |
| 6,819,471 B2 | 11/2004 | Amundson |
| 6,825,068 B2 | 11/2004 | Denis |
| 6,831,769 B2 | 12/2004 | Holman |
| 6,842,167 B2 | 1/2005 | Albert |
| 6,842,279 B2 | 1/2005 | Amundson |
| 6,842,657 B1 | 1/2005 | Drzaic |
| 6,865,010 B2 | 3/2005 | Duthaler |
| 6,866,760 B2 | 3/2005 | Paolini Jr. |
| 6,870,657 B1 | 3/2005 | Fitzmaurice |
| 6,909,532 B2 | 6/2005 | Chung |
| 6,922,276 B2 | 7/2005 | Zhang |
| 6,950,220 B2 | 9/2005 | Abramson |
| 6,967,640 B2 | 11/2005 | Albert |
| 6,980,196 B1 | 12/2005 | Turner |
| 6,982,178 B2 | 1/2006 | LeCain |
| 7,002,728 B2 | 2/2006 | Pullen |
| 7,012,600 B2 | 3/2006 | Zehner |
| 7,012,735 B2 | 3/2006 | Honeyman |
| 7,030,412 B1 | 4/2006 | Drzaic |
| 7,075,502 B1 | 7/2006 | Drzaic |
| 7,075,703 B2 | 7/2006 | O'Neil |
| 7,106,296 B1 | 9/2006 | Jacobson |
| 7,110,163 B2 | 9/2006 | Webber |
| 7,116,318 B2 | 10/2006 | Amundson |
| 7,148,128 B2 | 12/2006 | Jacobson |
| 7,167,155 B1 | 1/2007 | Albert |
| 7,170,670 B2 | 1/2007 | Webber |
| 7,173,752 B2 | 2/2007 | Doshi |
| 7,176,880 B2 | 2/2007 | Amundson |
| 7,190,008 B2 | 3/2007 | Amundson |
| 7,206,119 B2 | 4/2007 | Honeyman |
| 7,223,672 B2 | 5/2007 | Kazlas |
| 7,230,751 B2 | 6/2007 | Whitesides |
| 7,236,291 B2 | 6/2007 | Kaga et al. |
| 7,256,766 B2 | 8/2007 | Albert |
| 7,259,744 B2 | 8/2007 | Arango |
| 7,280,094 B2 | 10/2007 | Albert |
| 7,312,784 B2 | 12/2007 | Baucom |
| 7,321,459 B2 | 1/2008 | Masuda |
| 7,327,511 B2 | 2/2008 | Whitesides |
| 7,339,715 B2 | 3/2008 | Webber |
| 7,349,148 B2 | 3/2008 | Doshi |
| 7,352,353 B2 | 4/2008 | Albert |
| 7,365,394 B2 | 4/2008 | Denis |
| 7,365,733 B2 | 4/2008 | Duthaler |
| 7,382,363 B2 | 6/2008 | Albert |
| 7,388,572 B2 | 6/2008 | Duthaler |
| 7,411,719 B2 | 8/2008 | Paolini, Jr. |
| 7,420,549 B2 | 9/2008 | Jacobson |
| 7,442,587 B2 | 10/2008 | Amundson |
| 7,453,445 B2 | 11/2008 | Amundson |
| 7,492,497 B2 | 2/2009 | Paolini, Jr. |
| 7,535,624 B2 | 5/2009 | Amundson |
| 7,551,346 B2 | 6/2009 | Fazel |
| 7,554,712 B2 | 6/2009 | Patry |
| 7,583,427 B2 | 9/2009 | Danner |
| 7,598,173 B2 | 10/2009 | Ritenour |
| 7,605,799 B2 | 10/2009 | Amundson |
| 7,636,191 B2 | 12/2009 | Duthaler |
| 7,649,674 B2 | 1/2010 | Danner |
| 7,667,886 B2 | 2/2010 | Danner |
| 7,672,040 B2 | 3/2010 | Sohn |
| 7,679,814 B2 | 3/2010 | Paolini, Jr. |
| 7,688,497 B2 | 3/2010 | Danner |
| 7,785,988 B2 | 8/2010 | Amundson |
| 7,839,564 B2 | 11/2010 | Whitesides |
| 7,843,626 B2 | 11/2010 | Amundson |
| 7,859,637 B2 | 12/2010 | Amundson |
| 7,893,435 B2 | 2/2011 | Kazlas |
| 7,898,717 B2 | 3/2011 | Patry |
| 7,957,053 B2 | 6/2011 | Honeyman |
| 7,986,450 B2 | 7/2011 | Cao |
| 8,009,344 B2 | 8/2011 | Danner |
| 8,009,348 B2 | 8/2011 | Zehner |
| 8,027,081 B2 | 9/2011 | Danner |
| 8,049,947 B2 | 11/2011 | Danner |
| 8,077,141 B2 | 12/2011 | Duthaler |
| 8,089,453 B2 | 1/2012 | Comiskey |
| 8,208,193 B2 | 6/2012 | Patry |
| 8,319,759 B2 | 11/2012 | Jacobson |
| 8,373,211 B2 | 2/2013 | Amundson |
| 8,389,381 B2 | 3/2013 | Amundson |
| 8,498,042 B2 | 7/2013 | Danner |
| 8,610,988 B2 | 12/2013 | Zehner |
| 8,728,266 B2 | 5/2014 | Danner |
| 8,754,859 B2 | 6/2014 | Gates |
| 8,830,560 B2 | 9/2014 | Danner |
| 8,891,155 B2 | 11/2014 | Danner |
| 9,152,003 B2 | 10/2015 | Danner |
| 9,152,004 B2 | 10/2015 | Paolini, Jr. |
| 2002/0060321 A1 | 5/2002 | Kazlas |
| 2004/0105036 A1 | 6/2004 | Danner |
| 2005/0122306 A1 | 6/2005 | Wilcox |
| 2005/0122563 A1 | 6/2005 | Honeyman |
| 2007/0052757 A1 | 3/2007 | Jacobson |
| 2009/0122389 A1 | 5/2009 | Whitesides |
| 2009/0315044 A1 | 12/2009 | Amundson |
| 2011/0026101 A1 | 2/2011 | Wu |
| 2011/0140744 A1 | 6/2011 | Kazlas |
| 2011/0187683 A1 | 8/2011 | Wilcox et al. |
| 2011/0187684 A1 | 8/2011 | Amundson et al. |
| 2012/0293858 A1 | 11/2012 | Telfer |
| 2012/0320277 A1* | 12/2012 | Takata .................. 348/725 |
| 2015/0228666 A1 | 8/2015 | Paolini, Jr. |

OTHER PUBLICATIONS

Kitamura, T., et al., "Electrical toner movement for electronic paper-like display", Asia Display/IDW '01, p. 1517, Paper HCS1-1 (2001) Dec. 31, 2001.

Yamaguchi, Y., et al., "Toner display using insulative particles charged triboelectrically", Asia Display/IDW '01, p. 1729, Paper AMD4-4 (2001) Dec. 31, 2001.

International Search Report and Written Opinion for PCT/US2015/014842 Apr. 28, 2015.

* cited by examiner

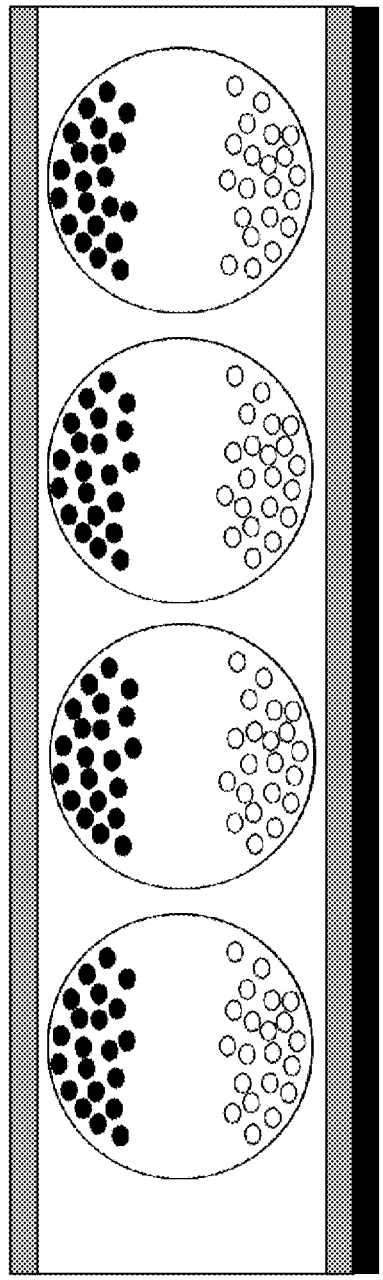

ELECTRO-OPTIC DISPLAY BACKPLANE STRUCTURES WITH DRIVE COMPONENTS AND PIXEL ELECTRODES ON OPPOSED SURFACES

REFERENCE TO RELATED APPLICATIONS

This application claims priority to U.S. Patent Application No. 61/937,168, filed Feb. 7, 2014. The entire contents of this application, and of all other U.S. patents and published and copending applications mentioned below, are herein incorporated by reference.

BACKGROUND OF INVENTION

In applications where individual electro-optic displays are tiled together to create a larger display, it is optimal for the viewing area to be completely active. Accordingly, this invention relates to an electro-optic display having a backplane with circuit elements on at least two surfaces, a plurality of pixels arranged in a matrix on the front surface of the backplane, at least one driver chip on the reverse surface (opposite the front surface of the backplane), and conductors connecting the plurality of pixels on the front surface to the driver chip on the reverse surface, such that the entire viewing surface area may be optically active.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

Some electro-optic materials are solid in the sense that the materials have solid external surfaces, although the materials may, and often do, have internal liquid- or gas-filled spaces. Such displays using solid electro-optic materials may hereinafter for convenience be referred to as "solid electro-optic displays". Thus, the term "solid electro-optic displays" includes rotating bichromal member displays, encapsulated electrophoretic displays, microcell electrophoretic displays and encapsulated liquid crystal displays.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed by applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

As noted above, electrophoretic media require the presence of a fluid. In most prior art electrophoretic media, this fluid is a liquid, but electrophoretic media can be produced using gaseous fluids; see, for example, Kitamura, T., et al., "Electrical toner movement for electronic paper-like display", IDW Japan, 2001, Paper HCS1-1, and Yamaguchi, Y., et al., "Toner display using insulative particles charged triboelectrically", IDW Japan, 2001, Paper AMD4-4). See also U.S. Pat. Nos. 7,321,459 and 7,236,291. Such gas-based electrophoretic media appear to be susceptible to the same types of problems due to particle settling as liquid-based electrophoretic media, when the media are used in an orientation which permits such settling, for example in a sign where the medium is disposed in a vertical plane. Indeed, particle settling appears to be a more serious problem in gas-based electrophoretic media than in liquid-based ones, since the lower viscosity of gaseous suspending fluids as compared with liquid ones allows more rapid settling of the electrophoretic particles.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Films and sub-assemblies containing electro-optic materials; see for example U.S. Pat. Nos. 6,982,178 and 7,839,564;

(d) Backplanes, adhesive layers and other auxiliary layers and methods used in displays; see for example U.S. Pat. Nos. D485,294; 6,124,851; 6,130,773; 6,177,921; 6,232,950; 6,252,564; 6,312,304; 6,312,971; 6,376,828; 6,392,786; 6,413,790; 6,422,687; 6,445,374; 6,480,182; 6,498,114; 6,506,438; 6,518,949; 6,521,489; 6,535,197; 6,545,291; 6,639,578; 6,657,772; 6,664,944; 6,680,725; 6,683,333; 6,724,519; 6,750,473; 6,816,147; 6,819,471; 6,825,068; 6,831,769; 6,842,167; 6,842,279; 6,842,657; 6,865,010; 6,967,640; 6,980,196; 7,012,735; 7,030,412; 7,075,703; 7,106,296; 7,110,163; 7,116,318; 7,148,128; 7,167,155; 7,173,752; 7,176,880; 7,190,008; 7,206,119; 7,223,672; 7,230,751; 7,256,766; 7,259,744; 7,280,094; 7,327,511; 7,349,148; 7,352,353; 7,365,394; 7,365,733; 7,382,363; 7,388,572; 7,442,587; 7,492,497; 7,535,624; 7,551,346; 7,554,712; 7,583,427; 7,598,173; 7,605,799; 7,636,191; 7,649,674; 7,667,886; 7,672,040; 7,688,497; 7,733,335; 7,785,988; 7,843,626; 7,859,637; 7,893,435; 7,898,717; 7,957,053; 7,986,450; 8,009,344; 8,027,081; 8,049,947; 8,077,141; 8,089,453; 8,208,193; and 8,373,211; and U.S. Patent Applications Publication Nos. 2002/0060321; 2004/0105036; 2005/0122306; 2005/0122563; 2007/0052757; 2007/0097489; 2007/0109219; 2007/0211002; 2009/0122389; 2009/0315044; 2010/0265239; 2011/0026101; 2011/0140744; 2011/0187683; 2011/0187689; 2011/0286082; 2011/0286086; 2011/0292319; 2011/0292493; 2011/0292494; 2011/0297309; 2011/0310459; and 2012/0182599; and International Application Publication No. WO 00/38000; European Patents Nos. 1,099,207 B1 and 1,145,072 B1;

(e) Color formation and color adjustment; see for example U.S. Pat. No. 7,075,502; and U.S. Patent Application Publication No. 2007/0109219;

(f) Methods for driving displays; see for example U.S. Pat. Nos. 7,012,600 and 7,453,445;

(g) Applications of displays; see for example U.S. Pat. Nos. 7,312,784 and 8,009,348; and (h) Non-electrophoretic displays, as described in U.S. Pat. Nos. 6,241,921; 6,950,220; 7,420,549 and 8,319,759; and U.S. Patent Application Publication No. 2012/0293858.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a so-called "microcell electrophoretic display". In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both assigned to Sipix Imaging, Inc.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed (using a variety of methods), the display itself can be made inexpensively.

Other types of electro-optic materials may also be used in the present invention. Of particular interest, bistable ferroelectric liquid crystal (FLC's) and cholesteric liquid crystal displays are known in the art.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

The manufacture of a three-layer electrophoretic display normally involves at least one lamination operation. For example, in several of the aforementioned MIT and E Ink patents and applications, there is described a process for manufacturing an encapsulated electrophoretic display in which an encapsulated electrophoretic medium comprising capsules in a binder is coated on to a flexible substrate comprising indium-tin-oxide (ITO) or a similar conductive coating (which acts as one electrode of the final display) on a plastic film, the capsules/binder coating being dried to form a coherent layer of the electrophoretic medium firmly adhered to the substrate. Separately, a backplane, containing an array of pixel electrodes and an appropriate arrangement of conductors to connect the pixel electrodes to drive circuitry, is prepared. To form the final display, the substrate having the capsule/binder layer thereon is laminated to the backplane using a lamination adhesive. (A very similar process can be used to prepare an electrophoretic display usable with a stylus or similar movable electrode by replacing the backplane with a simple protective layer, such as a plastic film, over which the stylus or other movable electrode can slide.) In one preferred form of such a process, the backplane is itself flexible and is prepared by printing the pixel electrodes and conductors on a plastic film or other flexible substrate. The obvious lamination technique for mass production of displays by this process is roll lamination using a lamination adhesive.

As discussed in the aforementioned U.S. Pat. No. 6,982, 178, (see column 3, line 63 to column 5, line 46) many of the components used in electrophoretic displays, and the methods used to manufacture such displays, are derived from technology used in liquid crystal displays (LCD's). For example, electrophoretic displays may make use of a backplane comprising an array of transistors or diodes and a corresponding array of pixel electrodes, and a "continuous" front electrode (in the sense of an electrode which extends over multiple pixels and typically the whole display) on a transparent substrate, these components being essentially the same as in LCD's. However, the methods used for assembling LCD's cannot be used with encapsulated electrophoretic displays. LCD's are normally assembled by forming the backplane and front electrode on separate glass substrates, then adhesively securing these components together leaving a small aperture between them, placing the resultant assembly under vacuum, and immersing the assembly in a bath of the liquid crystal, so that the liquid crystal flows through the aperture between the backplane and the front electrode. Finally, with the liquid crystal in place, the aperture is sealed to provide the final display.

This LCD assembly process cannot readily be transferred to encapsulated displays. Because the electrophoretic material is solid, it must be present between the backplane and the front electrode before these two integers are secured to each other. Furthermore, in contrast to a liquid crystal material, which is simply placed between the front electrode and the backplane without being attached to either, an encapsulated electrophoretic medium normally needs to be secured to both; in most cases the electrophoretic medium is formed on the front electrode, since this is generally easier than forming the medium on the circuitry-containing backplane, and the front electrode/electrophoretic medium combination is then laminated to the backplane, typically by covering the entire surface of the electrophoretic medium with an adhesive and laminating under heat, pressure and possibly vacuum. Accordingly, most prior art methods for final lamination of solid electrophoretic displays are essentially batch methods in which (typically) the electro-optic medium, a lamination adhesive and a backplane are brought together immediately prior to final assembly, and it is desirable to provide methods better adapted for mass production.

Electro-optic displays, including electrophoretic displays, can be costly; for example, the cost of the color LCD found in a portable computer is typically a substantial fraction of the entire cost of the computer. As the use of such displays spreads to devices, such as cellular telephones and personal digital assistants (PDA's), much less costly than portable computers, there is great pressure to reduce the costs of such displays. The ability to form layers of electrophoretic media by printing techniques on flexible substrates, as discussed above, opens up the possibility of reducing the cost of electrophoretic components of displays by using mass production techniques such as roll-to-roll coating using commercial equipment used for the production of coated papers, polymeric films and similar media.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active-matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode, which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner.

Processes for manufacturing active-matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Electro-optic displays are often used to form large area displays, for example in the form of large signs or billboards. Such large area displays are frequently formed by "tiling" (i.e., juxtaposing) a two-dimensional array of discrete electro-optic displays together since, for technical reasons, such as limitations on the size of backplanes produced by photolithography, individual electro-optic displays cannot economically exceed a certain size. To create the illusion of a single large area display, it is important that the whole visible area of the display be active, with no inactive borders between adjacent displays. Unfortunately, conventional electro-optic displays require driver electronics which are normally disposed around the periphery of the display. Such peripheral driver electronics are not a problem when displays are used individually, since the active area of the display is normally surrounded by a bezel which serves to hide the driver electronics. However, such peripheral driver electronics do create a problem when multiple displays are used to form a large area display since the peripheral areas are inherently optically inactive. Accordingly, there is a need a way of tiling electro-optic displays together to form large area displays without introducing inactive areas in peripheral portions of the individual displays.

SUMMARY OF INVENTION

Accordingly, this invention relates to an electro-optic display having a backplane with a front surface and a reverse surface on opposed sides of the backplane, the front surface having a plurality of pixel electrodes arranged in a matrix of rows and columns having row and columns lines with conductive vias at each row and column line, and the reverse surface having at least one driver chip connecting to the conductive vias at each row and column line, wherein the plurality of pixel electrodes on the front surface are electrically connected to the driver chip on the reverse surface, such that the entire viewing surface area may be optically active.

In another aspect, this invention provides for a backplane for an electro-optic display comprising a first major surface having a plurality of pixel electrodes arranged in an array of rows and columns having row and column lines, a second major surface opposed to the first major surface having at least two driver chips, and a plurality of conductive vias at each row line and each column line to electrically connect the row lines to the first driver chip and the column lines to the second driver chip.

In another aspect, this invention provides for an electro-optic assembly containing a backplane having a plurality of pixel electrodes on the front surface, at least one driver on the reverse surface and electrical connections between the pixel electrodes and the driver, such that almost 100% of the viewing surface may be optically active.

BRIEF DESCRIPTION OF DRAWINGS

FIG. 8 is a cross-sectional view of a bistable electrophoretic medium.

DETAILED DESCRIPTION

Figure 1:
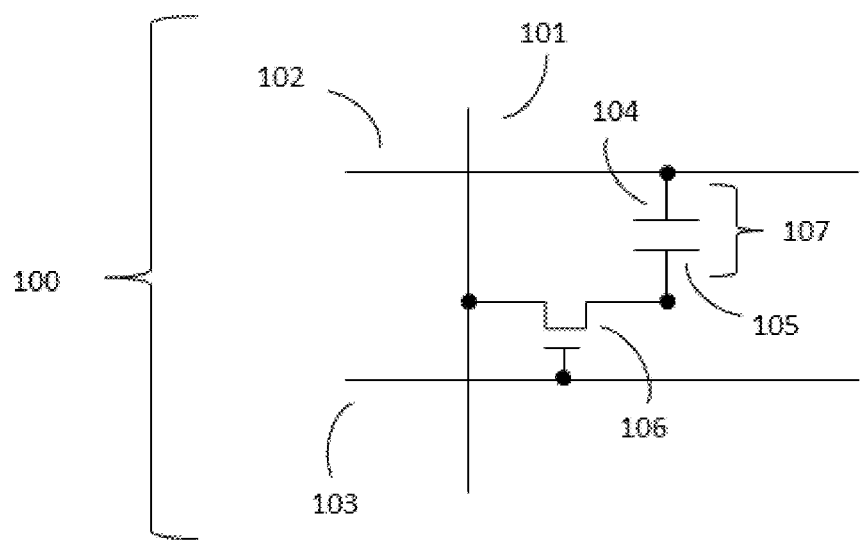
FIG. 1 is a schematic circuit diagram of one pixel of an active matrix electro-optic display according to some embodiments.

The use of electro-optic display technology is expanding beyond electronic document reader applications to a variety of electronic display products including product labels, retail shelf labels, device monitoring indicators, wristwatches, signs, and promotional or advertising displays. Typically, electro-optic displays are encased by a frame or a bezel to hide the electrical connections of the display which generally lay alongside the display. In some applications, specifically, large scale tiled displays, it is generally preferred that the entire viewing area of an electro-optic display be optically active; for example, a billboard made by tiling a plurality of electro-optic displays together to create a large display, where the entire viewing surface of each individual display is optically active and the space between each display is minimized, such that the large display appears as a single continuous display.

Accordingly, this invention provides for an electro-optic display having a backplane with circuit elements on at least two surfaces, a plurality of pixel electrodes arranged in an array of rows and columns on the front surface of the backplane having row and column lines, at least one driver chip on the reverse surface (opposite the front surface of the backplane), and conductive vias connecting the row and column lines of the plurality of pixel electrodes on the front surface to the driver chip on the reverse surface, such that the entire viewing surface area may be optically active.

In another aspect, this invention provides for an electro-optic display having a backplane with two major surfaces wherein a first major surface has a plurality of pixel electrodes, and a second major surface opposed to the first major surface has at least one driver chip, a plurality of gate lines with a conductive via for each gate line, a plurality of source lines with a conductive via for each source line, a plurality of common lines with at least one conductive via to electrically connect the plurality of pixel electrodes to the driver chip, such that the entire viewing surface area may be optically active.

In another aspect, this invention provides for an electro-optic assembly containing a backplane having a plurality of pixel electrodes on the front surface, at least one driver on the reverse surface and electrical connections between the pixel electrodes and the driver, such that almost 100% of the viewing surface may be optically active.

The term "backplane" is used herein consistent with its conventional meaning in the art of electro-optic displays and in the aforementioned patents and published applications, to mean a rigid or flexible material provided with one or more electrodes. The backplane may also be provided with electronics for addressing the display, or such electronics may be provided in a unit separate from the backplane. A backplane may contain multiple layers. A backplane may be referred to as a rear electrode structure. The front surface of a backplane refers to the surface closest to the front electrode of the display. The reverse surface of a backplane refers to the surface farthest from the front electrode.

The term "viewing surface" is used herein consistent with its conventional meaning in the art of electro-optic displays and in the aforementioned patents and published applications, to mean the surface closest to the front electrode (the surface remote from the backplane).

The term "non-viewing surface" is used herein to mean any surface or side that is not the viewing surface. This includes the reverse side of a backplane, the sides of a backplane and, if multi-layered, any layer of the backplane that is not on the viewing surface.

Typically, a backplane has an array of pixel electrodes. Each pixel electrode forms part of a "pixel unit" which usually also includes a thin-film transistor, a storage capacitor, and conductors that electrically connect each pixel unit to a driver chip. Although a pixel electrode is technically a subpart of a pixel unit, the terms "pixel" and "pixel electrode" are commonly used interchangeably and refer to a unit cell of a backplane active area. The terms "column lines" and "row lines" generally refer to the "gate lines" and "source lines" of a pixel transistor. These terms are used interchangeably herein.

FIG. 1 is an illustrative schematic of the circuitry of a type of single thin film transistor pixel (100), including a pixel electrode (105), a capacitor electrode (104), a thin-film transistor (106), a gate line (103), a source line (101) and a common (ground) line (102). The source line (101) is connected to the source of the transistor (106), the gate line (103) is connected to the gate of the transistor (106) and the drain of the transistor (106) is connected to the pixel electrode (105). The capacitor electrode (104) is connected to the ground line (102) so that the pixel electrode (105) and the capacitor electrode (104) together form a storage capacitor (107).

Figure 2:
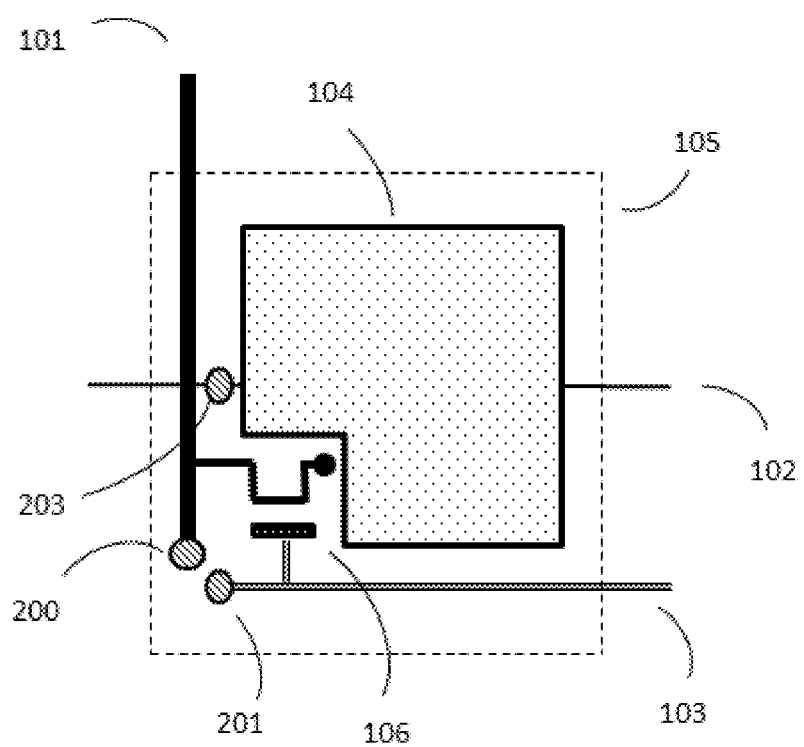
FIG. 2 is a top plan view showing a single pixel of the viewing surface of a display according to some embodiments.

FIG. 2 is an illustrative schematic of the present invention of a single pixel including a pixel electrode (105), a capacitor electrode (104), a thin-film transistor (106), a gate line (103), a source line (101) and a common (ground) line (102). Conductive vias at each gate line (201) and at each source line (200) electrically connect the pixel electrode to the driver on the reverse surface of the backplane. A conductive via (203) connects the ground lines (102) to the driver on the reverse surface.

The thin-film transistor of the pixel electrode may be electrically connected to the driver chip by formation of via apertures through the backplane. The apertures may be filled with conductive material to form vias interconnecting electronic components on the viewing side to electronic components on the reverse side of the backplane. The via apertures may be, for example, etched, punched, drilled or laser-drilled through the polymeric material of the backplane so as to connect the electronic components on the viewing side to the drivers on the reverse side. The via apertures may be filled using a variety of materials and techniques including printing (for example, ink-jet, screen, or offset printing) application of conductive resins, shadow-mask evaporation or conventional photolithographic methods. Simple electrical connections may be made along the edge of the substrate using thick film conductors.

Figure 3:
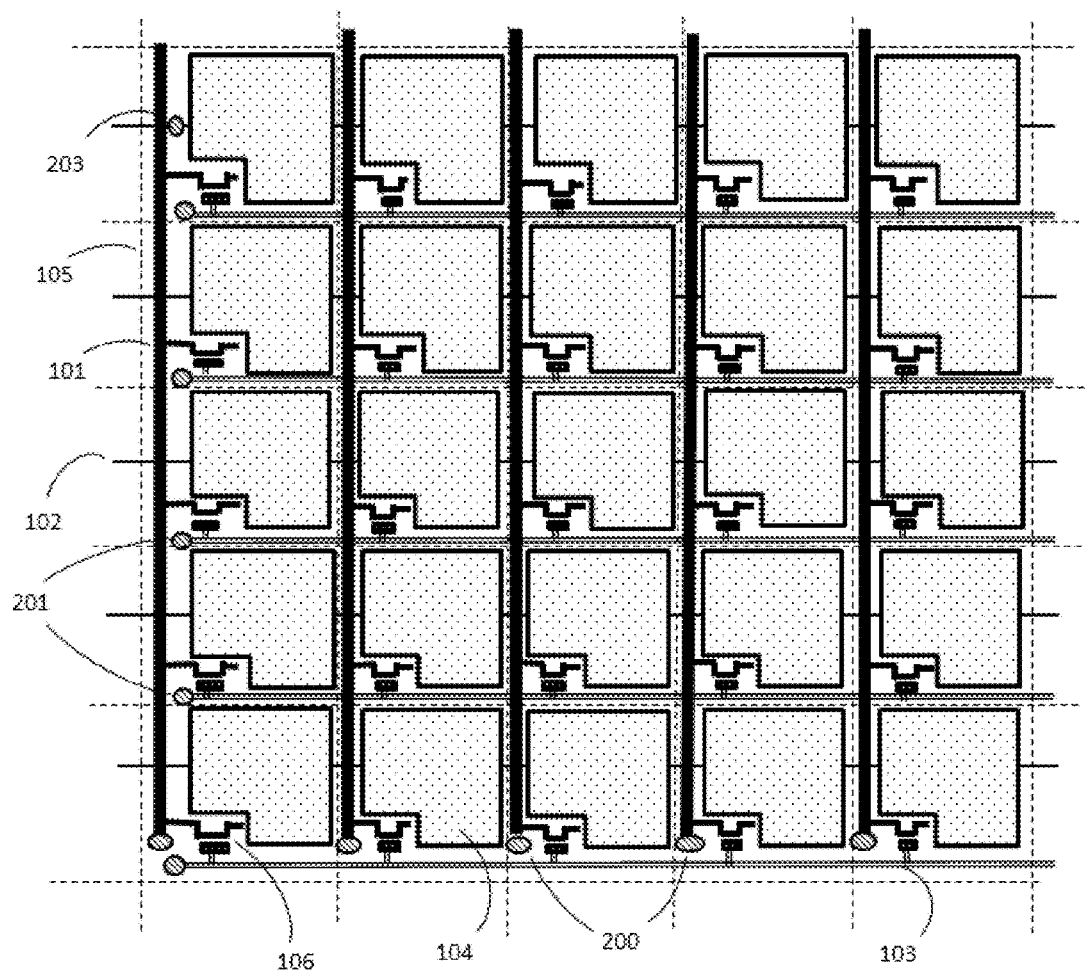
FIG. 3 is a top plan view of the front surface of a backplane of the present invention having a 5×5 pixel array.

FIG. 3 is an illustrative schematic of a 5×5 array of pixels of a backplane of the present invention which includes pixel electrodes (105), capacitor electrodes (104), thin-film transistors (106), gate lines (103), source lines (101), common (ground) lines (102), source line conductive vias (200), gate line conductive vias (201) and a common line conductive via (203). The pixel components are layered or sandwiched between semiconductor layers to provide electrical connections and prevent cross-talk between neighboring components. The pixel electrode, usually, is on the front surface of the backplane and is the closest layer to the viewing surface. The electro-optic layer attaches to the pixel electrode layer such that, essentially, the entire viewing surface is optically active. The pixel electrode layer may be light transmissive when the electro-optic layer acts to mask the underlying components on the backplane.

The array of transistors shown in FIG. 3 can be manufactured using any one of many appropriate methods. For example, vacuum based methods such as evaporation or sputtering can be used to deposit the materials necessary to form the transistor and thereafter the deposited material can be patterned. Alternatively, wet printing methods or transfer methods can be used to deposit the materials necessary to form the transistors. For fabrication of thin-film transistors, the substrate may be, for example: a silicon wafer; a glass plate; a steel foil; or a plastic sheet. The gate electrodes, for example, may be any conductive material such as metal or conductive polymer. The materials for use as the semiconductor layer, for example, can be inorganic materials such as amorphous silicon or polysilicon. Alternatively, the semiconductor layer may be formed of organic semiconductors such as: polythiophene and its derivatives; oligothiophenes; and pentacene. In general, any semiconductive material useful in creating conventional thin film transistors can be used in this embodiment. The material for the gate dielectric layer may be an organic or an inorganic material. Examples of suitable materials include, but are not limited to, polyimides, silicon dioxide, and a variety of inorganic coatings and glasses. The source and gate electrodes may be made of any conductive material such as metal or conductive polymer.

The array of transistors described in reference to FIG. 3 may be any type of transistors used for addressing an electronic display. Additional (i.e., resistors) or alternative (i.e., capacitors and transistors) drive components may be used as well. In another implementation, the addressing electronic backplane could incorporate diodes as the non-linear element, rather than transistors. The present invention is applicable to a variety of electronic displays, including electrophoretic displays, liquid crystal displays, emissive displays (including organic light emitting materials) and rotating ball displays.

Alternatively, a passive matrix backplane rather than an active matrix backplane may be used to drive the display. As is well-known in the art, a passive matrix backplane uses two sets of elongate electrodes extending at right angles to display an image on the screen. Each pixel is defined by the intersection of two electrodes, one from each set. By altering the electrical charge at a given intersection, the electro-optic properties of the corresponding pixel may be changed.

Figure 4:
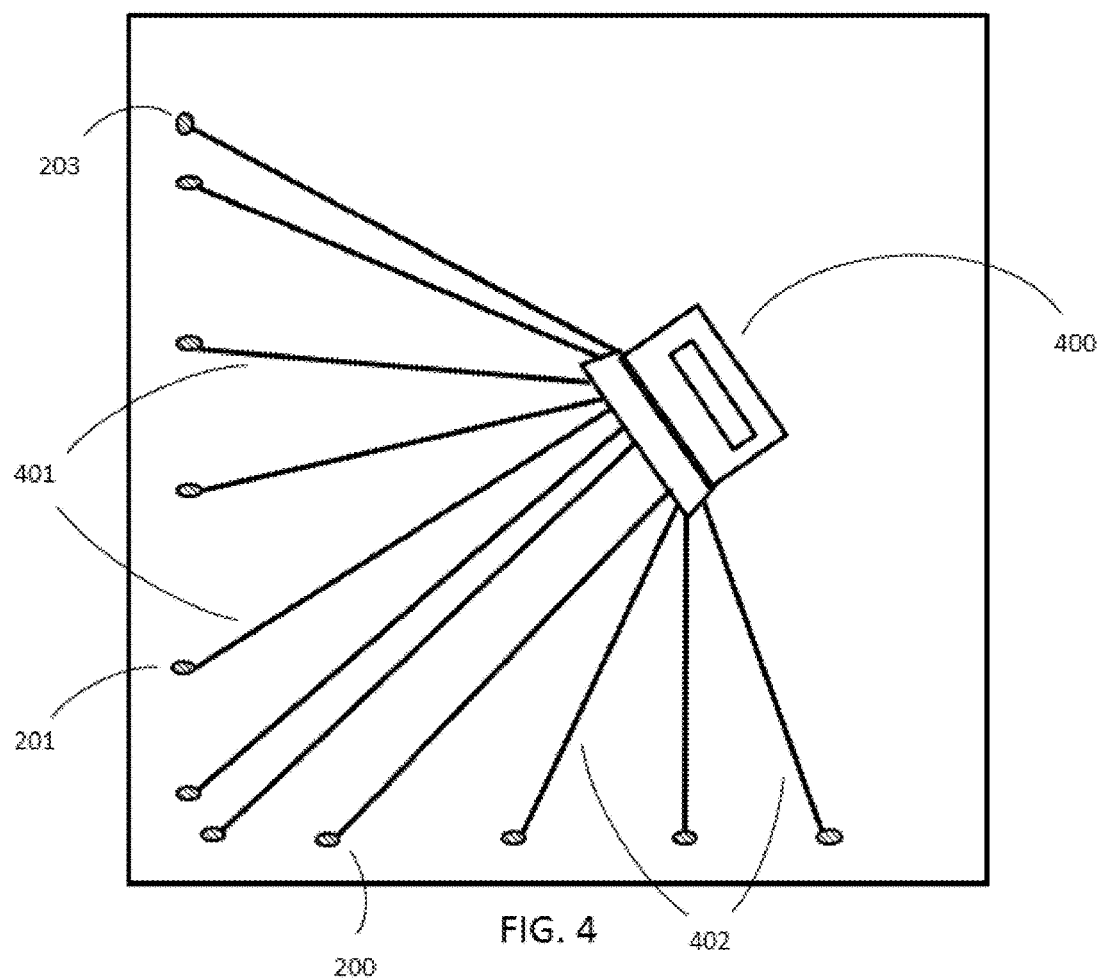
FIG. 4 is a plan view of the reverse surface of the backplane shown in FIG. 3 a single driver and connections thereto.

FIG. 4 is an illustrative schematic of a reverse surface of a backplane of the present invention showing a driver (400), conductive vias (200, 201, 203) and conductors (401, 402) connecting the pixels in a 5×5 array on the front surface to the driver on the reverse surface. FIG. 4 shows the conductive vias located at the end of each column and row according to the preferred embodiment, however, the vias may be located anywhere along the gate and source lines to make the electrical connection.

FIG. 4 illustrates a plan view of the conductive leads and the elements for an array of transistors for driving a display. An array comprises source lines and gate lines with conductive vias connecting a driver to pixel electrodes. To address a pixel electrode, voltages are applied to appropriate source lines and gate lines. Changes in the optical characteristics of a display element are achieved by addressing a pixel electrode that is associated with the display element.

From the foregoing, it will be seen that the present invention provides for an electro-optic assembly containing a backplane having a plurality of pixels arranged in rows and columns on the front surface, at least one driver on the reverse surface and electrical connections between the row and column lines of the pixel array and the driver, such that 100% of the viewing surface may be optically active.

Display size and resolution may be optimized according to the electro-optic display application, substrate materials and PCB design guidelines. Pixel size may vary from approximately 100 μm to more than 10 mm per side (approximately 10,000 μm$^2$ to 100 mm$^2$). Conductive vias may range in size from 25 μm to 250 μm depending on the pixel size of the display. Individual display sizes may range from as large as multiple feet squared to as small as less than an inch squared. For large scale displays with a large viewing distance, a larger pixel size is preferred. For example, a billboard display may be constructed from individual displays of approximately 400 mm×400 mm with 4 mm×4 mm pixels and conductive vias that are approximately 250 μm. For large scale displays with a shorter viewing distance, a smaller pixel size is preferred. For example, a wall display may be constructed from individual displays of approximately 200 mm×200 mm with 200 μm×200 μm pixels.

The number of driver chips may be optimized according to design rules. At least one driver chip may be used. Preferably, at least two driver chips are used; one to drive the gate lines and one to drive the source lines.

Figure 5:
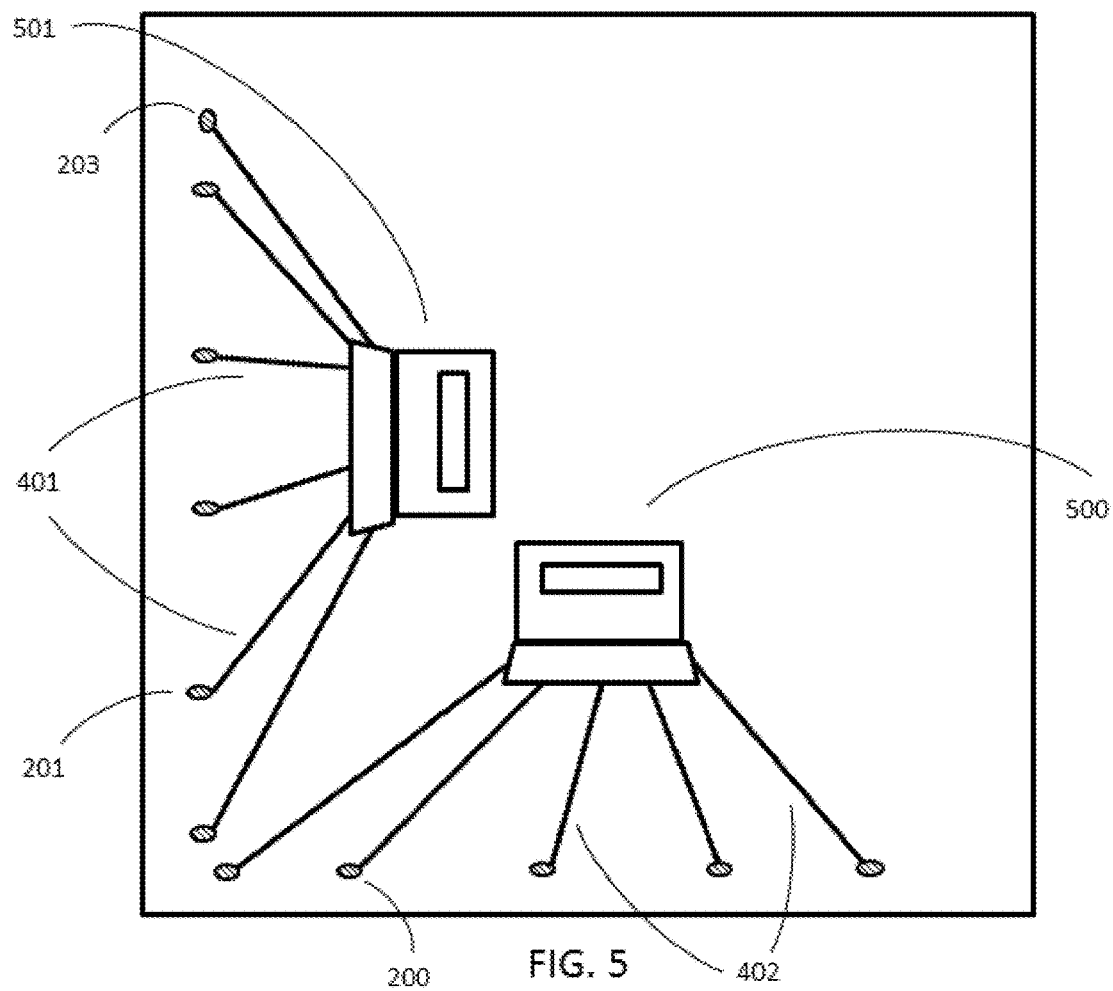
FIG. 5 is a plan view similar to that of FIG. 4 but is an embodiment showing two drivers and connections thereto.

FIG. 5 is an illustrative schematic of the present invention showing two drivers (500, 501), conductive vias to the source lines (200) and gate lines (201), a conductive via to the common lines (203) and conductors (401, 402) connecting the pixels in a 5×5 array on the front surface to the driver on the reverse surface. One driver (500) addresses the source lines and the other driver (501) addresses the gate lines and common lines.

In one aspect of the present invention, a thin-film transistor, capacitor electrode and pixel electrode may be fabricated on the front surface of the backplane while a driver and connecting gate and source lines (and any additional electronic components) are formed on the opposed surface, then the via apertures are formed, and finally the via apertures are filled to form vias. Vias may be filled with a conductive substance, such as solder or conductive epoxy, or an insulating substance, such as epoxy. Alternatively, the gate and source lines may be formed on the front surface of the backplane. In another alternative, the substrate may be drilled and filled to form vias, then, the thin film transistor array is formed with the source and gate lines landing on (aligning with) the conductive vias.

In another alternative, the backplane may be formed by printing the source lines, gates lines and thin film transistors on a substrate, then, drilling an filling conductive vias, then, covering the vias with dielectric and, finally, printing the pixel electrodes.

The backplane substrate material may be any suitable material that allows for the fabrication of one or more via apertures, such as polyester, polyimide, multilayered fiberglass, stainless steel, PET or glass. Holes are punched, drilled, abraded, or melted through where conductive paths are desired, including through any dielectric layers as necessary. Alternatively, the apertures may be formed on the backplane materials prior to assembly and then aligned when assembled. A conductive ink may be used to fabricate and fill the holes. The pixel electrode may be printed using a conductive ink as is known in the art. The ink viscosity, as well as the aperture size and placement, may be optimized so that the ink fills the apertures. When the reverse surface structures are printed, again using conductive ink, the holes are again filled. By this method, the connection between the front and back of the substrate may be made automatically.

The backplane of the display may comprise a substrate having a thin-film transistor array on the front surface, conductive vias located at each column and row, a driver on the reverse surface of the substrate, and gate and source lines connecting the thin-film transistor array to the driver.

Alternatively, a printed circuit board may be used as the rear electrode structure. The front of the printed circuit board may have copper pads etched in the desired shape. The plated vias connect the electrode pads to an etched wire structure (or conductor) on the reverse surface of the printed circuit board. The wires may be run to the reverse surface rear of the printed circuit board and a connection can be made using a standard connector such as a surface mount connector or using a flex connector and anisotropic glue.

Alternatively, a flex circuit such a copper-clad polyimide may be used for the rear electrode structure. Printed circuit board may be made of polyimide, which acts both as the flex connector and as the substrate for the electrode structure. Rather than copper pads, electrodes may be etched into the copper covering the polyimide printed circuit board. The plated through vias connect the electrodes etched onto the substrate the rear of the printed circuit board, which may have an etched conductor network thereon (the etched conductor network is similar to the etched wire structure).

Alternatively, the rear electrode structure can be made entirely of printed layers. A conductive layer can be printed onto the back of a display comprised of a clear, front electrode and a printable display material. A clear electrode may be fabricated from indium tin oxide or conductive polymers such as polyanilines and polythiophenes. A dielectric coating may be printed leaving areas for vias. Then, the back layer of conductive ink may be printed. If necessary, an additional layer of conductive ink can be used before the final ink structure is printed to fill in the holes.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

Moreover, the encapsulated electrophoretic display is highly compatible with flexible substrates. This enables high-resolution thin-film transistor displays in which the transistors are deposited on flexible substrates like flexible glass, plastics, or metal foils. The flexible substrate used with any type of thin film transistor or other nonlinear element need not be a single sheet of glass, plastic, metal foil, though. Instead, it could be constructed of paper. Alternatively, it could be constructed of a woven material. Alternatively, it could be a composite or layered combination of these materials.

Figure 6:
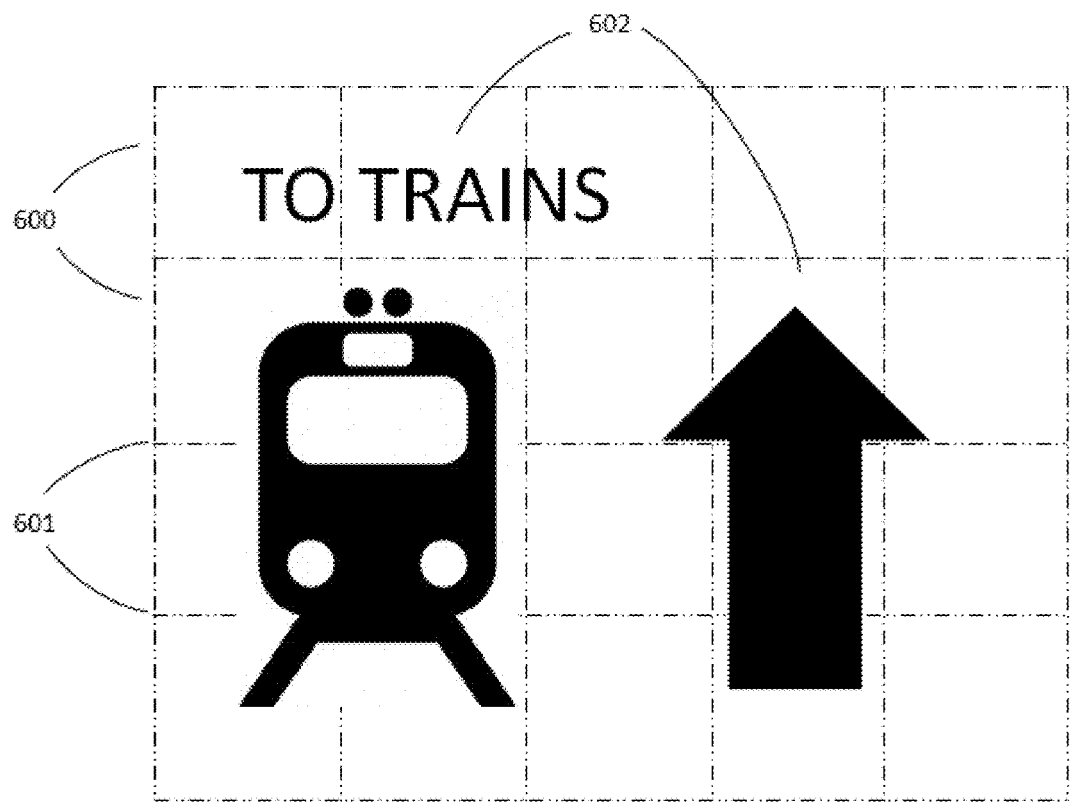
FIG. 6 is an illustrative representation of the present invention used in a large scale sign.
Figure 7:
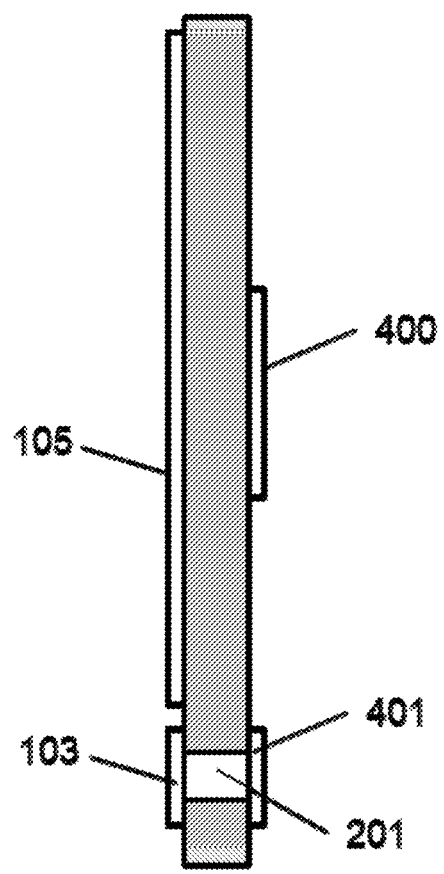
FIG. 7 is a cross-sectional view of a backplane of the invention showing a pixel electrode, via, and driver chip.

FIG. 6 is an illustrative representation of the present invention used in a large scale sign. The individual electro-optic displays (600) are tiled in a 5 by 4 array. The dotted lines (601) represent the edges of the individual displays. This figure shows a sign for a train station that displays icons and words (602) indicating the direction to the trains.

The electro-optic display may have a front plane comprising, in order beginning from the backplane, a layer of electro-optic material disposed on the thin-film transistor array, a single continuous electrode disposed on the electro-optic material and, optionally, a front protective layer or other barrier layers. The upper surface of the protective layer forms the viewing surface of the display. An edge seal may extend around the periphery of the electro-optic material to prevent the ingress of moisture to the electro-optic material.

In another aspect, this invention provides for an electro-optic display wherein the electro-optic material masks the electrical connections such that the viewing surface may be completely optically-active. The electro-optic material of the front plane laminate may overlay the pixel electrodes to obscure the backplane connections from the viewing surface. In another aspect, the electro-optic material of the front plane laminate may extend beyond the pixel electrodes to obscure the backplane connections from the viewing surface.

In another aspect, as described in U.S. Pat. No. 8,705,164, front electrode connections may be on a non-viewing side of the backplane. Alternatively, front electrode connections may be made on the viewing surface. Such connections create non-active areas on the viewing surface. These non-active areas are usually approximately 2 mm in diameter but may be larger or smaller depending on the display voltage requirements and the total number of connections. In comparison to the overall active viewing area, the display may still appear to be 100% active. In the present invention, an active viewing area of at least 95% is preferred.

It will be apparent to those skilled in the art that numerous changes and modifications can be made in the specific embodiments of the invention described above without departing from the scope of the invention. Accordingly, the whole of the foregoing description is to be interpreted in an illustrative and not in a limitative sense.

The invention claimed is:

1. An electro-optic display having a backplane, the backplane comprising:
    a substrate having a first major surface comprising a plurality of pixel electrodes arranged in an array of rows and columns having row and column lines, the pixel electrodes covering at least 95% of the first major surface;
    the substrate having a second major surface opposed to the first major surface, the second major surface having a first driver chip; and
    a first plurality of conductive vias electrically connecting the row lines of the pixel array through the substrate to the first driver chip.

2. The display of claim 1 further comprising a second plurality of conductive vias electrically connecting the column lines of the pixel array to the first driver chip.

3. The display of claim 1 further comprising:
    a second driver chip on the second major surface; and
    a plurality of second conductive vias electrically connecting the column lines of the pixel array to a second driver chip.

4. The display of claim 1, wherein the backplane is a printed circuit board, a flex circuit, or a substrate of printed layers.

5. The display of claim 1, wherein each of the plurality of pixel electrodes has a thin-film transistor associated therewith.

6. The display of claim 1, wherein the pixel size is between 3 mm×3 mm and 5 mm×5 mm.

7. An assembly comprising a plurality of displays of claim 1.

8. The assembly of claim 7, wherein each of the plurality of displays is interconnected.

9. The assembly of claim 8, wherein the assembly is configured to display a contiguous image across multiple displays.

* * * * *